United States Patent
Wu et al.

(10) Patent No.: US 10,176,998 B2
(45) Date of Patent: Jan. 8, 2019

(54) SEMICONDUCTOR DEVICE

(71) Applicant: TAIWAN SEMICONDUCTOR MANUFACTURING CO., LTD., Hsinchu (TW)

(72) Inventors: Chun-Yu Wu, Changhua County (TW); Meng-Chun Shih, Hsinchu (TW); Chin-Huang Wang, Taoyuan County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/496,080

(22) Filed: Apr. 25, 2017

(65) Prior Publication Data
US 2018/0308700 A1    Oct. 25, 2018

(51) Int. Cl.
| | | |
|---|---|---|
| *H01L 21/28* | (2006.01) | |
| *H01L 21/324* | (2006.01) | |
| *H01L 21/326* | (2006.01) | |
| *H01L 29/788* | (2006.01) | |

(52) U.S. Cl.
CPC ...... *H01L 21/28273* (2013.01); *H01L 21/324* (2013.01); *H01L 21/326* (2013.01); *H01L 29/7885* (2013.01)

(58) Field of Classification Search
None
See application file for complete search history.

(56) References Cited

U.S. PATENT DOCUMENTS

| | | | | |
|---|---|---|---|---|
| 2006/0133153 A1* | 6/2006 | Shih | ........... | G11C 16/0466 365/185.28 |
| 2006/0291285 A1* | 12/2006 | Mokhlesi | ........... | G11C 11/5628 365/185.18 |
| 2007/0287253 A1* | 12/2007 | Takeuchi | ........... | H01L 27/11568 438/257 |
| 2008/0133984 A1* | 6/2008 | Kim | ........... | G11C 29/50 714/718 |
| 2015/0213901 A1* | 7/2015 | Kim | ........... | G11C 16/14 365/185.03 |
| 2018/0040384 A1* | 2/2018 | Lazarov | ........... | G11C 29/50016 |

OTHER PUBLICATIONS

Chun-Yu Wu et al., "Origin of Initial Rapid Cell Current Reduction in Non-Volatile One-Time Programming Memory" IEEE Electron Device Letters, vol. 37, No. 2, Feb. 2016., p. 176-178.

* cited by examiner

*Primary Examiner* — Khaja Ahmad
(74) *Attorney, Agent, or Firm* — McClure, Qualey & Rodack, LLP

(57) ABSTRACT

A semiconductor device includes a substrate, a dielectric layer and a floating gate. The dielectric layer disposed on the substrate. The floating gate disposed on the dielectric layer. After a first programming process, the floating gate is configured to store first electrons that are to be combined with ions from the dielectric layer. After a second programming process, the floating gate is configured to store second electrons, and a number of the second electrons is larger than a number of the first electrons.

20 Claims, 7 Drawing Sheets

SEMICONDUCTOR DEVICE

BACKGROUND

Conventional one-time programming (OTP) memory suffers from poor data retention after a baking process at high temperature. At high temperature, ions with positive charges released from an interface between a dielectric layer and a substrate of the one-time programming (OTP) memory recombine with electrons stored in a floating gate of the one-time programming (OTP) memory, which results in poor data retention.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
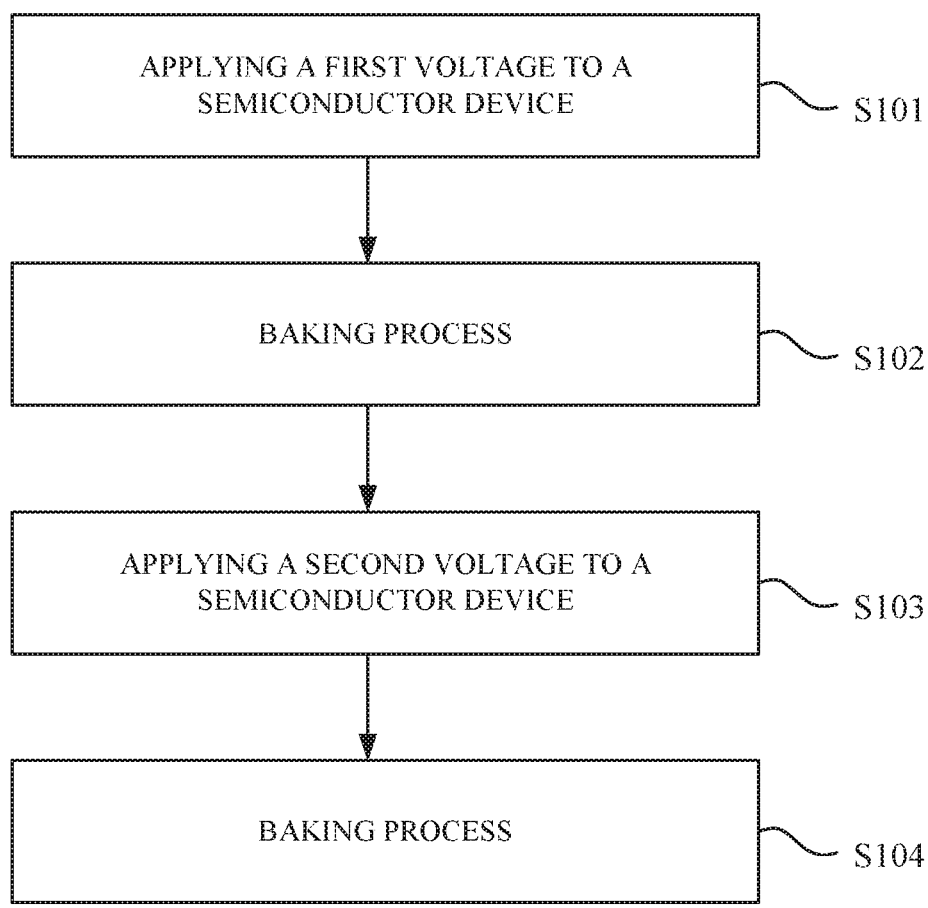
FIG. 1 is a flowchart of a method of processing a semiconductor device in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The term mask, photolithographic mask, photomask and reticle are used to refer to the same item.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, that is, to mean including but not limited to.

Reference is now made to FIG. 1. FIG. 1 is a flowchart of a method 100 of processing a semiconductor device in accordance with some embodiments of the present disclosure. The method 100 includes operations S101, S102, S103 and S104. These operations are given for illustrative purposes. Additional operations are within the contemplated scoped of the present disclosure. For example, in various embodiments, additional operations are provided before, during, and/or after the operations in the method 100, and/or some of the operations described are replaced or eliminated for other embodiments of the method 100.

Figure 2A:
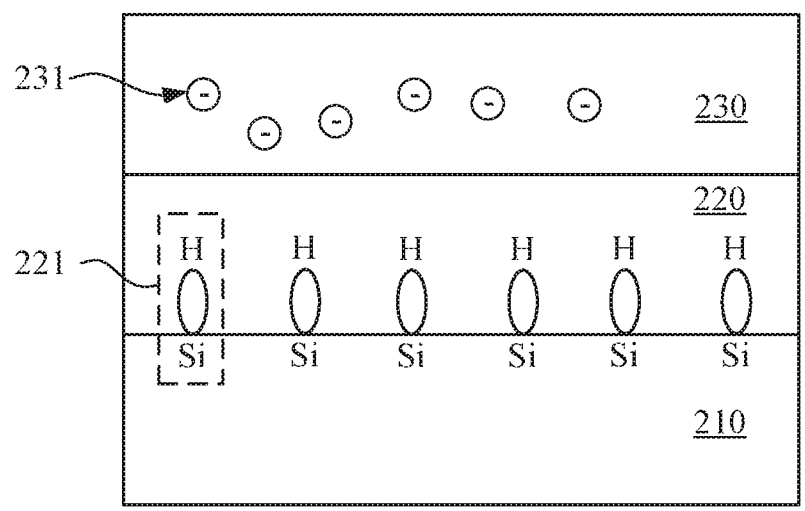
FIGS. 2A-2E are cross-sectional diagrams of various stages in the manufacture of a semiconductor device, using the method in FIG. 1, in accordance with some embodiments of the present disclosure.

FIGS. 2A-2E are cross-sectional diagrams of various stages in the manufacture of a semiconductor device 200, using the method in FIG. 1, in accordance with some embodiments of the present disclosure. With respect to the embodiments of FIGS. 2B-2E, like elements in FIG. 2A are designated with the same reference numbers for ease of understanding. For illustration, the method 100 in FIG. 1 is discussed below with reference to FIGS. 2A-2E.

For illustration in FIG. 2A, the semiconductor device 200 includes a substrate 210, a dielectric layer 220 and a floating gate 230. The dielectric layer 220 is disposed on the substrate 210. The floating gate 230 is disposed on the dielectric layer 220 and configured to store electrons 231. There are Si—H bonds 221 at an interface of the substrate 210 and the dielectric layer 220. In some embodiments, the floating gate 230 includes doped polysilicon implanted with a p-type or an n-type impurity, followed by an annealing process to activate the implanted impurity. In other embodiments, the floating gate 230 includes metal, metal alloys, metal suicides, metal nitrides, and the like. The material of the floating gate 230 is given for illustrative purposes only. Various materials of the floating gate 230 are within the contemplated scope of the present disclosure.

With reference to the method 100 in FIG. 1 and FIG. 2A, in operation S101, a first voltage is applied to the semiconductor device 200 to generate electrons 231 flowing in a floating gate 230 of the semiconductor device 200.

In some embodiments, the operation S101 is also referred to as a programming operation. In further embodiments, the operation S101 is also referred to as a soft programming operation.

In some embodiments, the floating gate 230 is formed in a suitable process that includes deposition processes, lithography patterning processes, etching processes, or combinations thereof. The deposition processes include physical vapor deposition (PVD), chemical vapor deposition (CVD), atomic layer deposition (ALD), plasma enhanced chemical vapor deposition (PECVD), remote plasma chemical vapor deposition (RPCVD), molecular organic chemical vapor deposition (MOCVD), sputtering, plating, other suitable methods, or combinations thereof. The lithography patterning processes include photoresist coating (e.g., spin on coating), soft baking, mask aligning, exposure, post-exposure baking, developing the photoresist, rinsing, drying (e.g., hard baking), other suitable processes, or combinations thereof. The lithography exposure process may be implemented or replaced by other proper methods such as maskless lithography, electron-beam writing, ion-beam writing, and molecular imprint. The etching processes include dry etching, wet etching, or combinations thereof.

In some embodiments, the Si—H bonds in FIG. 2A are formed because of by-products (e.g., hydrogen or hydrogen-containing chemicals) generated from a process of forming the dielectric layer 220.

In some embodiments, the semiconductor device 200 is a one-time programming (OTP) device. Explained in a different way, once the semiconductor device 200 is programmed, it cannot be reversed or reprogrammed. In some embodiments, the semiconductor device 200 is a P-channel one-time programming (OTP) device, and the first voltage is applied to a drain (not shown in FIG. 2A) of the semiconductor device 200. In some embodiments, the drain and a source of the semiconductor device 200 are doped regions formed in the substrate 210 by appropriate implantation or diffusion of, for example, group III elements, such as boron (B), or the like. In some embodiments, the doped regions (not shown) are formed on the substrate 210. In other embodiments, the doped regions are formed in a P-well structure. In various embodiments, the doped regions are formed in an N-well structure. In some embodiments, the doped regions are formed in a dual-well structure. The configuration of the semiconductor device 200 being the P-channel one-time programming (OTP) device is given for illustrative purposes. Various configurations of the semiconductor device 200 are within the contemplated scope of the present disclosure.

In some embodiments, the first voltage ranges from about −5 V to about −6 V. The values of the first voltage are given for illustrative purposes only. Various values of the first voltage are within the contemplated scope of the present disclosure.

In some embodiments, the substrate 210 includes silicon (Si). In various embodiments, the substrate 210 includes other suitable semiconductor materials, such as germanium (Ge), silicon germanium (SiGe), and gallium arsenide (GaAs). In further embodiments, the substrate 210 further includes other suitable compound semiconductor materials, such as silicon carbide (SiC), indium arsenide (InAs), and indium phosphide (InP). In some embodiments, the substrate 210 also includes other suitable alloy semiconductor materials, such as silicon-germanium carbide (SiGeC), gallium arsenide phosphide (GaAsP), and indium gallium phosphide (InGaP). In other embodiments, the substrate 210 includes a semiconductor-on-insulator such as silicon-on-insulator (SOI). In some other embodiments, the substrate 210 includes a gradient semiconductor layer, and/or further includes a semiconductor layer overlying another semiconductor layer of a different type such as a silicon layer on a silicon germanium layer. In some embodiments, the substrate 210 further includes various features such as doped regions, buried layer, and/or an epitaxy layer (not shown).

In some embodiments, the dielectric layer 220 is formed of silicon dioxide ($SiO_2$) or a high-k material. The dielectric layer 220 includes a material having a dielectric constant (k value), and contains nitrogen, carbon, hydrogen, oxygen, fluorine, and combinations thereof. The dielectric layer 220 is formed by formed in a suitable process that includes deposition processes, lithography patterning processes, etching processes, or combinations thereof. The deposition processes include chemical vapor deposition (CVD), spin-on, atomic layer deposition (ALD), plasma enhanced chemical vapor deposition (PECVD), and other suitable processes. The lithography patterning processes include photoresist coating (e.g., spin on coating), soft baking, mask aligning, exposure, post-exposure baking, developing the photoresist, rinsing, drying (e.g., hard baking), other suitable processes, or combinations thereof. The lithography exposure process may be implemented or replaced by other proper methods such as maskless lithography, electron-beam writing, ion-beam writing, and molecular imprint. The etching processes include dry etching, wet etching, or combinations thereof.

In some embodiments, the dielectric layer 220 is a high-k dielectric layer. In various embodiments, the high-k dielectric layer includes hafnium oxide ($HfO_2$). Alternatively or additionally, the high-k dielectric layer includes Hf—X—O material, where X is silicon or metal, such as hafnium silicon oxide (HfSiO), hafnium silicon oxynitride (HfSiON), hafnium tantalum oxide (HfTaO), hafnium titanium oxide (HMO), or hafnium zirconium oxide (HfZrO). In some embodiments, the high-k dielectric layer includes hafnium dioxide-alumina ($HfO_2$—$Al_2O_3$) alloy, zirconium oxide ($ZrO_2$), or Zr—X—O material, where X is silicon or metal, such as zirconium silicate ($ZrSiO_4$) or zirconium aluminate (ZrAlO). In some embodiments, the high-k dielectric layer includes titanium oxide ($TiO_2$), or Ti—X—O material, where X is silicon or metal. In some embodiments, the high-k dielectric layer includes lanthanum oxide ($La_2O_3$), or La—X—O material, where X is silicon or metal, other suitable high-k dielectric material, or combinations thereof. The high-k dielectric layer is formed by a suitable process, such as atomic layer deposition (ALD), chemical vapor deposition (CVD), physical vapor deposition (PVD), remote plasma chemical vapor deposition (RPCVD), plasma enhanced chemical vapor deposition (PECVD), metal organic chemical vapor deposition (MOCVD), sputtering, other suitable processes, or combinations thereof. In some embodiments, the high-k dielectric layer optionally includes a multilayer structure. For example, the high-k dielectric layer includes a dielectric stack with a layer of silicon oxide and a layer of high-k dielectric film.

Figure 2B:
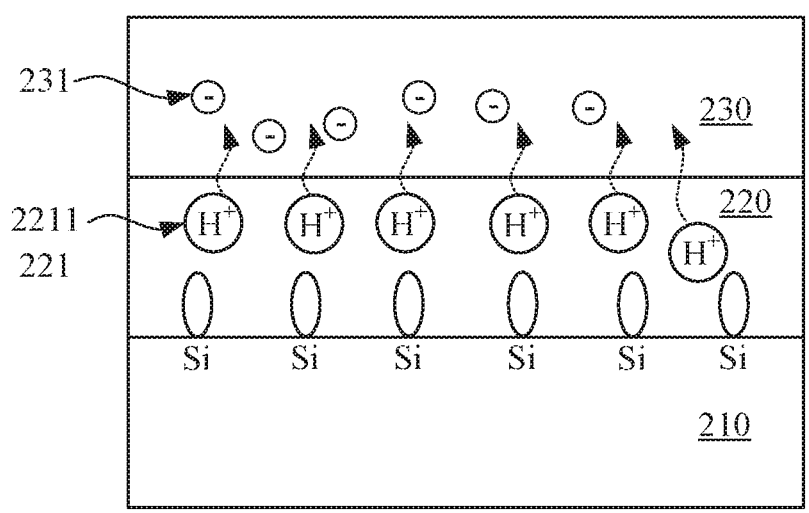
Figure 2C:
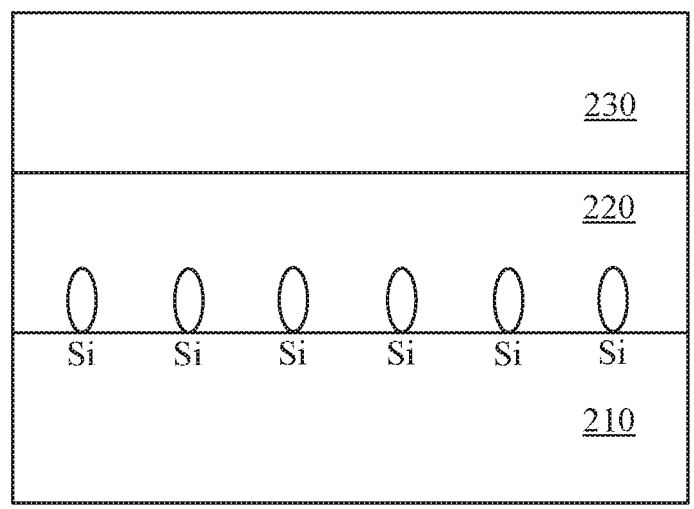

With reference to the method 100 in FIG. 1, FIG. 2B and FIG. 2C, in operation S102, a baking process is executed to the semiconductor device 200. During the baking process of the semiconductor device 200, the electrons 231 reduce the Si—H bonds 221 in the dielectric layer 220 of the semiconductor device 200.

In some embodiments, as shown in FIG. 2B, the Si—H bonds 221 are dissociated to generate plural hydrogenated complexes 2211. For example, the hydrogenated complexes 2211 include hydrogen ion ($H^+$), hydrogen ($H_2$), hydronium ($H_3O^+$). $H^+$, $H_2$, $H_3O^+$ are given for illustrative purposes. Various types of the hydrogenated complexes 2211 are within the contemplated scope of the present disclosure. The hydrogenated complexes 2211 then diffuse toward the floating gate 230 due to the electrons 231 and result in recombination with the electrons 231 in the floating gate 230. Explained in a different way, the hydrogenated complexes 2211 released from the Si—H bonds 221 are consumed because of the recombination with the electrons 231 during the operation S102. As a result, as shown in FIG. 2C, a number of the Si—H bonds are reduced or eliminated after the baking process in the operation S102.

In some embodiments, the semiconductor device 200 is experienced a negative floating gate charge storage as well as the high temperature baking process, majority carrier in the semiconductor device 200 are generated from an induced inversion layer and react with the dielectric layer 220 containing the Si—H bonds. For illustration, the semiconductor device 200 is experienced with the electron 231 storage and the high temperature baking process, holes in the P-channel one-time programming (OTP) device are generated from an induced inversion layer and react with the dielectric layer 220 containing the Si—H bonds. As a result, the Si—H bonds are broken, and the hydrogenated complexes 2211 are generated.

In some embodiments, the baking process in the operation S102 is an annealing process. Temperature of the baking process is about 85° C. to about 250° C. A baking time of the baking process is about 5 minutes to about 1 hour. The values of the temperature of the baking process and the baking time are given for illustrative purposes only. Various values of the temperature of the baking process and the baking time are within the contemplated scope of the present disclosure.

Figure 2D:
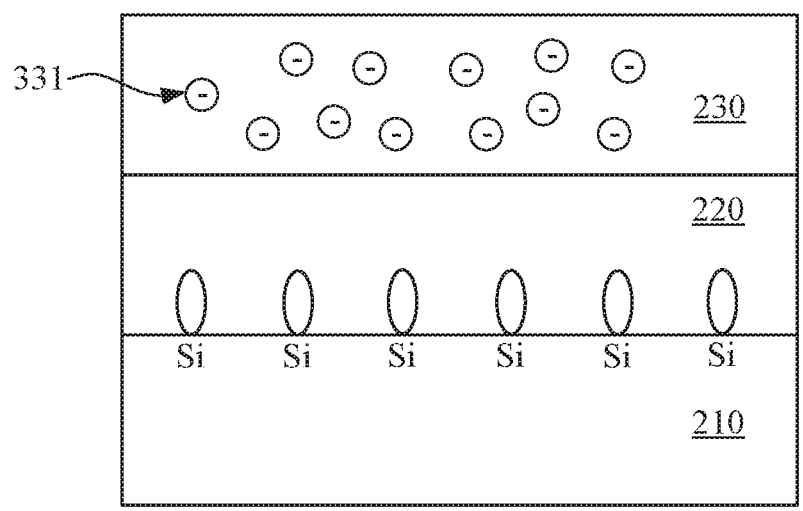

With reference to the method 100 in FIG. 1 and FIG. 2D, in operation S103, after the semiconductor device 200 is baked in the operation S102, a second voltage is applied to the semiconductor device 200 to generate plural electrons 331 flowing in the floating gate 230 of the semiconductor device 200. Since the hydrogenated complexes 2211 are released from the Si—H bonds 221 in FIG. 2A and consumed in the operation S102, no hydrogenated complexes are generated between the floating gate 230 and the dielectric layer 220.

In some embodiments, the operation S103 is also referred to as a programming operation. In further embodiments, the operation S103 is also referred to as a formal programming operation.

In some embodiments, the semiconductor device is a one-time programming (OTP) device. In some embodiments, the semiconductor device 200 is a P-channel one-time programming (OTP) device, and the second voltage is applied to the drain (not shown in FIG. 2D) of the semiconductor device 200. The floating gate 230 is configured to store the electrons 331 after a one-time programming (OTP) process. In some embodiments, the drain and a source of the semiconductor device 200 are doped regions formed in the substrate 210 by appropriate implantation or diffusion of, for example, group III elements, such as boron (B), or the like. In some embodiments, the doped regions are formed on the substrate 210. In other embodiments, the doped regions are formed in a P-well structure. In some embodiments, the doped regions are formed in an N-well structure. In some embodiments, the doped regions are formed in a dual-well structure. The configuration of the semiconductor device 200 being the P-channel one-time programming (OTP) device is given for illustrative purposes. Various configurations of the semiconductor device 200 are within the contemplated scope of the present disclosure.

In some embodiments, the second voltage ranges from about −7 V to about −7.25 V. The values of the second voltage are given for illustrative purposes only. Various values of the second voltage are within the contemplated scope of the present disclosure.

In some embodiments, a magnitude of the second voltage used in the second programming process (e.g., a formal programming process) is greater than a magnitude of the first voltage in the first programming process (e.g., a soft programming process). As a result, the number of the electrons 331 stored in the floating gate 230 in the operation S103 is larger than the number of the electrons 231 stored in the floating gate 230 in the operation S101.

Figure 2E:
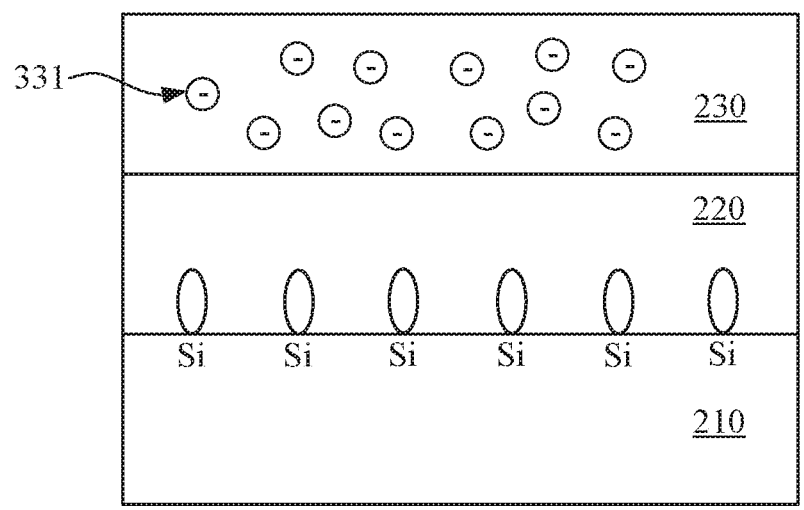

With reference to the method 100 in FIG. 1 and FIG. 2E, in operation S104, another baking process is performed to the semiconductor device 200. During the baking process, less hydrogenated complexes would be dissociated to recombine with the electrons 331 and then the number of the electrons 331 is not rapidly reduced. As a result, after the semiconductor device 200 is applied with the baking process, the electrons 331 are maintained in the floating gate 230. Explained in a different way, data retention of the semiconductor device 200 after the baking process in the operation S104 is effectively improved.

In some embodiments, the baking process in the operation S104 is an annealing process. Temperature of the baking process is about 85° C. to about 250° C. The values of the temperature of the baking process are given for illustrative purposes only. Various values of the temperature of the baking process are within the contemplated scope of the present disclosure.

In some embodiments, the baking process in the operation S104 after the programming process in the operation S103 is needed to ensure data retention.

Figure 3:
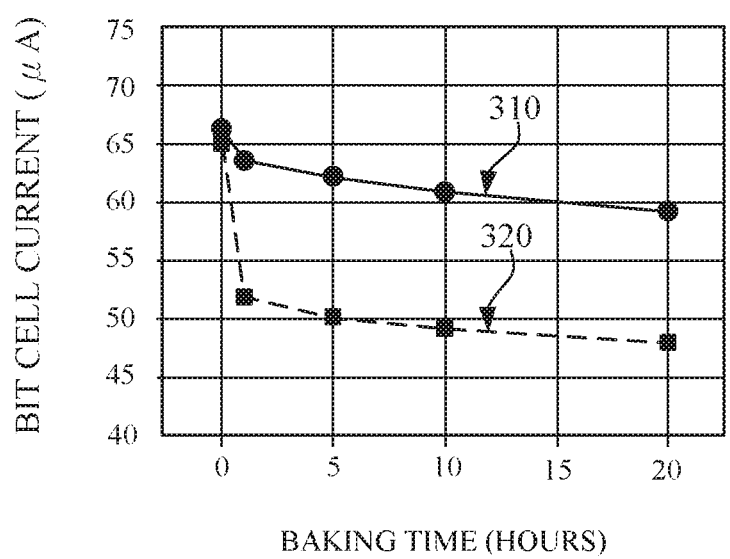
FIG. 3 is a schematic diagram showing a relationship between bit cell current and baking time of the semiconductor device in FIG. 2E, in accordance with some embodiments of the present disclosure.

Reference is made to FIG. 3. FIG. 3 is a schematic diagram showing a relationship between bit cell current and baking time of the semiconductor device 200 in FIG. 2E. In some embodiments, the semiconductor device 200 is baked at 200° C. A curve 310 shown in solid line represents the semiconductor device 200 has been performed the operations S101, S102 and S103. A curve 320 shown in dashed line represents another semiconductor device has been merely performed one programming process (i.e., the operation S103) without the operations S101 and S102. Because hydrogenated complexes are generated from Si—H bonds in a dielectric layer of the other semiconductor device during a subsequent baking process, the hydrogenated complexes diffuse toward a floating gate of the other semiconductor device and recombine with electrons programmed in the floating gate of the other semiconductor device. As a result, as shown by the curve 320, a bit cell current of the semiconductor device that has only been performed the operation S103 drops rapidly after the baking process at 200° C. for about or more than 1 hour. In contrast, as shown by the curve 310, a bit cell current of the semiconductor device 200 merely slightly decreases after the baking process at 200° C. for about of more than 1 hour. Explained in a different way, the other semiconductor device merely being performed one programming process (i.e., the operation S103) suffers from bit cell current reduction after the subsequent baking process, but the semiconductor device 200 being performed two programming processes (i.e., the operations S101 and S103) and the baking process (i.e., the operation S102) has a better bit cell current performance. Therefore, the method 100 performed to the semiconductor device 200 effectively improves the bit cell current performance.

Compared to the aforementioned approaches, the soft programming process (i.e., the operation S101) and the additional baking process (i.e., the operation S102) in the present disclosure are performed before the formal programming (i.e., the operation S103) to the semiconductor device 200. Because the hydrogenated complexes 2211 is released and consumed in the operation S102, the electrons 331 stored in the floating gate 230 is maintained after the semiconductor device is applied with any subsequent baking process (e.g., the baking process in the operation S104). In addition, compared to an ability of data retention of the aforementioned approaches, an ability of data retention of the semiconductor device 200 is improved. For example, a semiconductor device of the aforementioned approaches saves data for about 10 years at 85° C., and the semiconductor device 200 of the present disclosure saves data for about 10 years at 125° C. to 150° C.

The above description of the method 100 includes exemplary operations, but the operations of the method 100 are not necessarily performed in the order described. The order of the operations of the method 100 disclosed in the present disclosure are able to be changed, or the operations are able to be executed simultaneously or partially simultaneously as appropriate, in accordance with the spirit and scope of various embodiments of the present disclosure.

In various embodiments, a first programming process (e.g., a soft programming process) is performed to the semiconductor device 200 to generate the electrons 231 to be stored in the floating gate 230 of the semiconductor device 200. As above mentioned, the electrons 231 stored in the floating gate 230 are to be combined with ions (e.g., the hydrogenated complexes 2211 generated from dissociation of the Si—H bonds 221) from the dielectric layer 220 of the semiconductor device 200. In some embodiments, the first programming process is performed by a channel hot hole induced hot electron (CHHIHE) programming method. The channel hot hole induced hot electron (CHHIHE) programming method of the first programming process is given for illustrative purposes. Various methods of the first programming process are within the contemplated scope of the present disclosure.

In some embodiments, the first programming process is performed by applying a first negative voltage to the semiconductor device 200. In some embodiments, the first negative voltage ranges from about −5 V to about −6 V. The values of the first negative voltage are given for illustrative purposes only. Various values of the first negative voltage are within the contemplated scope of the present disclosure.

In some embodiments, electron-hole pairs are generated by channel hot hole induced hot electron (CHHIHE) programming method in the drain of the semiconductor device 200 (e.g., the P-channel one-time programming (OTP) device), electrons (i.e., the electrons 231) are able to attain sufficient energy to be injected into the floating gate 230, and then induced an inversion layer of holes. It is understood that as critical dimensions and a thickness of the dielectric layer 220 decrease, a programming voltage (e.g., about −5 V to about −6 V) required to achieve a similar hot carrier injection effect as described above also decreases.

In some embodiments, during a baking process (e.g., an annealing process) of the semiconductor device 200. After the baking process at high temperature, the hydrogenated complexes 2211 and interface states could be produced from the dissociation of the Si—H bonds by the holes in the inverted substrate 210. Subsequently, the released hydrogenated complexes 2211 diffuse toward the floating gate 230 and result in the recombination with the charges (i.e., the electrons 231) in the floating gate 230. Explained in a different way, the electrons 231 reduce the Si—H bonds 221 in the dielectric layer 220 of the semiconductor device 200.

After the first programming process, a second programming process (e.g., a formal programming process) is performed to the semiconductor device 200 to generate the electrons 331 to be stored in the floating gate 230 of the semiconductor device 200. In some embodiments, the second programming process is performed by the channel hot hole induced hot electron (CHHIHE) programming method. The method of the second programming process is given for illustrative purposes. Various methods of the second programming process are within the contemplated scope of the present disclosure.

In some embodiments, the second programming process is performed by applying a second negative voltage to the semiconductor device 200, and a magnitude of the second negative voltage is greater than a magnitude of the first negative voltage. In some embodiments, the second negative voltage ranges from about −7 V to about −7.25 V. The values of the second negative voltage are given for illustrative purposes only. Various values of the second negative voltage are within the contemplated scope of the present disclosure.

In some embodiments, electron-hole pairs are generated by channel hot hole induced hot electron (CHHIHE) programming method in the drain of the semiconductor device 200 (e.g., the P-channel one-time programming (OTP) device), and electrons (i.e., the electrons 331) are able to attain sufficient energy to be injected into the floating gate 230. It is understood that as critical dimensions and a thickness of the dielectric layer 220 decrease, a programming voltage (e.g., about −7 V to about −7.25 V) required to achieve a similar hot carrier injection effect as described above also decreases.

In some embodiments, after the second programming process is performed to the semiconductor device 200, the semiconductor device 200 is baked. Because the Si—H bonds are reduced during the baking process after the first programming process, the electrons 331 are not reduced when the semiconductor device 200 is baked after the second programming process. Explained in a different way, the electrons 331 are maintained in the floating gate 230 after the semiconductor device is performed the second programming process and then baked.

Based on the above embodiments, the first programming process is performed to the semiconductor device 200 to generate the electrons 231 in order to reduce the Si—H bonds in the dielectric layer 220. As a result, the electrons 331 stored in the floating gate 230 by the second programming process are maintained after the semiconductor device is performed the second programming process and then baked. Therefore, compared to the aforementioned approaches, the ability of data retention of the semiconductor device 200 is effectively improved after the baking process (e.g., the annealing process) in the operation S104.

In some embodiments, a semiconductor device is disclosed that includes a substrate, a dielectric layer and a floating gate. The dielectric layer disposed on the substrate. The floating gate disposed on the dielectric layer. After a first programming process, the floating gate is configured to store first electrons that are to be combined with ions from the dielectric layer. After a second programming process, the floating gate is configured to store second electrons, and a number of the second electrons is larger than a number of the first electrons.

Also disclosed is a method that includes the operations below. A first voltage is applied to a semiconductor device to generate a plurality of first electrons flowing in a floating gate of the semiconductor device. During a baking process of the semiconductor device, the plurality of first electrons reduces Si—H bonds in a dielectric layer of the semiconductor device. After the semiconductor device is baked, a second voltage is applied to the semiconductor device to generate a plurality of second electrons flowing in the floating gate of the semiconductor device.

Also disclosed is a method that includes the operations below. A first programming process is performed to a semiconductor device, to generate a plurality of first electrons to be stored in a floating gate of the semiconductor device, and to be combined with ions from a dielectric layer of the semiconductor device. After the first programming process, a second programming process is performed to the semiconductor device, to generate a plurality of second electrons to be stored in the floating gate of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    applying a first voltage to a semiconductor device to generate a plurality of first electrons flowing in a floating gate of the semiconductor device;
    during a baking process of the semiconductor device, the plurality of first electrons reducing Si—H bonds in a dielectric layer of the semiconductor device; and
    after the semiconductor device is baked, applying a second voltage to the semiconductor device to generate a plurality of second electrons flowing in the floating gate of the semiconductor device.

2. The method of claim 1, wherein applying the first voltage to the semiconductor device comprises:
    applying a first negative voltage to the semiconductor device.

3. The method of claim 2, wherein applying the second voltage to the semiconductor device comprises:
    applying a second negative voltage to the semiconductor device, wherein a magnitude of the second negative voltage is greater than a magnitude of the first negative voltage.

4. The method of claim 1, further comprising:
    after the second voltage is applied to the semiconductor device, baking the semiconductor device.

5. The method of claim 1, wherein during the baking process of the semiconductor device, the Si—H bonds are dissociated to generate a plurality of hydrogenated complexes.

6. The method of claim 5, the plurality of first electrons reducing Si—H bonds comprises:
    recombining the plurality of hydrogenated complexes with the plurality of first electrons.

7. The method of claim 1, further comprising:
    maintaining the plurality of second electrons in the floating gate after the semiconductor device is applied with the second voltage and then baked.

8. A method, comprising:
    performing a first programming process to a semiconductor device, to generate a plurality of first electrons to be stored in a floating gate of the semiconductor device, and to be combined with hydrogen ions from a dielectric layer of the semiconductor device; and
    after the first programming process, performing a second programming process to the semiconductor device, to generate a plurality of second electrons to be stored in the floating gate of the semiconductor device.

9. The method of claim 8, wherein performing the first programming process to the semiconductor device comprises:
    applying a first negative voltage to the semiconductor device.

10. The method of claim 9, wherein performing the second programming process to the semiconductor device comprises:
    applying a second negative voltage to the semiconductor device, wherein a magnitude of the second negative voltage is greater than a magnitude of the first negative voltage.

11. The method of claim 8, further comprising:
    after the second programming process is performed to the semiconductor device, baking the semiconductor device.

12. The method of claim 8, further comprising:
    during a baking process of the semiconductor device, the plurality of first electrons reducing Si—H bonds in the dielectric layer of the semiconductor device.

13. The method of claim 12, wherein during the baking process of the semiconductor device, the Si—H bonds are dissociated to generate a plurality of hydrogenated complexes.

14. The method of claim 13, wherein the plurality of first electrons reducing the Si—H bonds in the dielectric layer of the semiconductor device comprises:
    recombining the plurality of hydrogenated complexes with the plurality of first electrons.

15. A method, comprising:
    generating first electrons in a floating gate of a semiconductor device;
    after generating the first electrons, generating hydrogenated complexes, in a dielectric layer of the semiconductor device, to be combined with the first electrons; and
    after the hydrogenated complexes are combined with the first electrons, generating second electrons in the floating gate of the semiconductor device.

16. The method of claim 15, wherein generating the first electrons is performed by applying a first negative voltage to the semiconductor device.

17. The method of claim 16, wherein generating the second electrons is performed by applying a second negative voltage to the semiconductor device, wherein the first negative voltage is higher than the second negative voltage.

18. The method of claim 15, wherein generating the hydrogenated complexes is performed by baking the semiconductor device.

19. The method of claim 15, wherein generating the hydrogenated complexes is performed by dissociating Si—H bonds in the dielectric layer.

20. The method of claim 15, further comprising:
    after generating the second electrons, baking the semiconductor device.

* * * * *